(12) United States Patent
Kavalieros et al.

(10) Patent No.: US 10,565,138 B2
(45) Date of Patent: Feb. 18, 2020

(54) MEMORY DEVICE WITH MULTIPLE MEMORY ARRAYS TO FACILITATE IN-MEMORY COMPUTATION

(71) Applicant: Intel Corporation, Santa Clara, CA (US)

(72) Inventors: Jack Kavalieros, Portland, OR (US); Ram Krishnamurthy, Portland, OR (US); Sasikanth Manipatruni, Portland, OR (US); Gregory Chen, Portland, OR (US); Van Le, Beaverton, OR (US); Amrita Mathuriya, Portland, OR (US); Abhishek Sharma, Hillsboro, OR (US); Raghavan Kumar, Hillsboro, OR (US); Phil Knag, Hillsboro, OR (US); Huseyin Sumbul, Portland, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/146,534

(22) Filed: Sep. 28, 2018

(65) Prior Publication Data

US 2019/0205273 A1 Jul. 4, 2019

(51) Int. Cl.
| | | |
|---|---|---|
| *G11C 8/00* | (2006.01) | |
| *G06F 13/16* | (2006.01) | |
| *H01L 25/18* | (2006.01) | |
| *H03K 19/21* | (2006.01) | |
| *G11C 11/408* | (2006.01) | |
| *H01L 23/522* | (2006.01) | |
| *G11C 11/419* | (2006.01) | |

(52) U.S. Cl.
CPC ...... *G06F 13/1694* (2013.01); *G11C 11/4087* (2013.01); *G11C 11/419* (2013.01); *H01L 23/5226* (2013.01); *H01L 25/18* (2013.01); *H03K 19/215* (2013.01)

(58) Field of Classification Search
CPC .................................................... G06F 13/1694
USPC .................................................... 365/230.01
See application file for complete search history.

(56) References Cited

U.S. PATENT DOCUMENTS

| | | | | |
|---|---|---|---|---|
| 6,335,873 B1* | 1/2002 | Kawaguchi | ......... | G11C 11/4125 365/63 |
| 2014/0140397 A1* | 5/2014 | Kim | ......... | G11C 11/41 375/240.12 |
| 2017/0285990 A1* | 10/2017 | Chen | ......... | G06F 3/0625 |

\* cited by examiner

*Primary Examiner* — Hoai V Ho
(74) *Attorney, Agent, or Firm* — Green, Howard, & Mughal LLP

(57) ABSTRACT

Techniques and mechanisms for providing data to be used in an in-memory computation at a memory device. In an embodiment a memory device comprises a first memory array and circuitry, coupled to the first memory array, to perform a data computation based on data stored at the first memory array. Prior to the computation, the first memory array receives the data from a second memory array of the memory device. The second memory array extends horizontally in parallel with, but is offset vertically from, the first memory array. In another embodiment, a single integrated circuit die includes both the first memory array and the second memory array.

24 Claims, 10 Drawing Sheets

201 Receiving first data from a memory controller coupled to the memory device

202 Storing the first data to a first memory array of the memory device

203 After the storing, communicating the first data from the first array to a second array of memory cells of the memory device

204 Communicating from the second array a first signal indicating a logic state based on a bit of the first data

205 With first circuitry of the memory device, performing a data computation based on the first signal

206 Storing a result of the data computation at the second array

FIG. 2

MEMORY DEVICE WITH MULTIPLE MEMORY ARRAYS TO FACILITATE IN-MEMORY COMPUTATION

BACKGROUND

1. Technical Field

Embodiments of the invention generally relate to operation of a memory device and more particularly, but not exclusively, to circuit structures for implementing an in-memory computation.

2. Background Art

In modern image, speech, and pattern recognition operations, comparing, matching, multiplying and other processing of sample data is often required. Machine learning algorithms are used in various applications such as embedded-sensor networks and computer vision. The operation of pattern recognition can be used for classification in machine learning. Pattern recognition is also used for multimedia applications such as object detection or speech recognition. Computation in pattern recognition is one type of repetitive process which has traditionally required regular memory accesses, and as such, has consumed significant energy.

BRIEF DESCRIPTION OF THE DRAWINGS

The various embodiments of the present invention are illustrated by way of example, and not by way of limitation, in the figures of the accompanying drawings and in which:

FIG. 2 is a flow diagram illustrating elements of a method to provide data for an in-memory computation according to an embodiment.

DETAILED DESCRIPTION

Figure 1A:
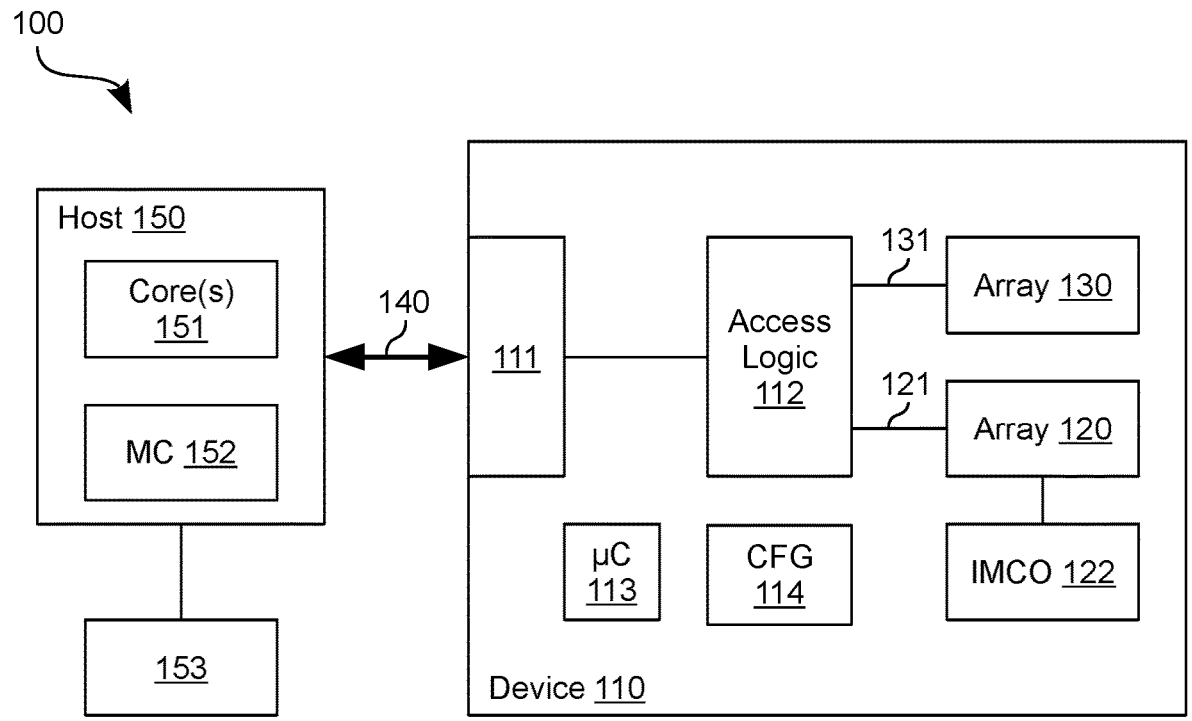
FIG. 1A is a functional block diagram illustrating elements of a system to perform an in-memory computation according to an embodiment.

Embodiments discussed herein variously provide techniques and mechanisms for providing data to be used in an in-memory computation at a memory device. As used herein in the context of "in-memory computing," "in-memory compute operation," "in-memory data computation" and related phrases, the term "in-memory" refers to the characteristic of an action being performed locally at a memory device which includes both a memory array and interface logic by which the memory device is to couple to, and communicate with, some memory controller, processor or other external agent.

For example, a memory device may include a first array of memory cells (or "memory array") and circuitry, coupled thereto, which is operable to detect a logic state based on one or more bits currently stored by the first array. Such circuitry may perform one or more data computations based on the logic state and, for example, provide a computation result as data to be stored back to the first array. In some embodiments, the memory device further comprises a second array of memory cells to facilitate an efficient provisioning of data for such in-memory computations. By providing a memory device which includes two memory arrays (e.g., one as a repository for data to be loaded to the other), various embodiments facilitate power efficient and/or time efficient retrieval of data for use in in-memory computations—e.g., where the same data is communicated between the arrays repeatedly over time without requiring the overhead and delay of communications between the memory device and a memory controller. In some embodiments, a memory device further provides additional timing and/or space efficiency by having relatively short interconnects between memory arrays which are offset vertically from one another—e.g., wherein the memory arrays overlap each other at least in part.

Certain features of various embodiments far described herein with reference to a memory device comprising a first memory array and a second memory array which variously extend each in parallel with a first plane, where the second memory array is offset from the first memory array in a direction which is orthogonal to the first plane. For example, respective rows and columns of the first array and the second array may variously extend each in parallel with a first ("horizontal") plane—e.g., wherein the first array and the second array are offset from one another in an orthogonal ("vertical") direction to said first plane. However, other embodiments may not be limited in this regard—e.g., wherein the first memory array and the second memory array are each in the same first plane.

Circuit structures of the memory device may interconnect, and implement communication between, the first array and the second array. As a result, data previously stored to the second array can be communicated to the first array, wherein any interconnect coupled between the memory device and a memory controller (or, for example, any interconnect external to the memory device) is excluded from participating in such data communication. In some embodiments, weight values and/or other data may be stored once to the second array, and then (over time) repeatedly communicated from the second array to the first array—e.g., where a same type of in-memory computation is to be performed numerous times. By providing an additional memory array locally at a memory device, embodiments variously improve the speed and/or energy efficiency of data provisioning for in-memory computations.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including a memory device which supports in-memory computation.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

For purposes of the embodiments, the transistors in various circuits, modules, and logic blocks are Tunneling FETs (TFETs). Some transistors of various embodiments may comprise metal oxide semiconductor (MOS) transistors, which include drain, source, gate, and bulk terminals. The transistors may also include Tri-Gate and FinFET transistors, Gate All Around Cylindrical Transistors, Square Wire, or Rectangular Ribbon Transistors or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bipolar junction transistors-BJT PNP/NPN, BiCMOS, CMOS, etc., may be used for some transistors without departing from the scope of the disclosure.

It is pointed out that those elements of the figures having the same reference numbers (or names) as the elements of any other figure can operate or function in any manner similar to that described, but are not limited to such.

FIG. 1A shows features of a system 100 to provide data for use in an in-memory computation according to an embodiment. System 100 is one example of an embodiment wherein a memory device comprises a first memory array and circuitry, coupled thereto, which is operable to perform a computation based on data stored at the first memory device. A second memory array of the memory device is coupled for loading of such data into the first memory array—e.g., wherein the second array is offset vertically from the first array. Input/output (IO) circuitry of the memory device facilitates coupling of the memory device to a memory controller and/or other external host logic—e.g., wherein the IO circuitry variously provides such external host logic with access to the first memory array and the second memory array.

As shown in FIG. 1A, system 100 includes a memory device 110 and a host 150 coupled, via an interconnect 140, to an input/output (IO) interface 111 of memory device 110. Host 150 illustrates any of a variety of one or more agents to control operation of memory device 110. In the example shown, host 150 comprises a memory controller MC 152 to provide access to memory device 110 for one or more cores 151 of a processor that is included in (or in other embodiments, coupled to) host 150. Such a processor may include circuitry configured to execute a general-purpose operating system and/or other software for a computer platform that includes system 100. In one embodiment, memory device 110 is an integrated circuit (IC) chip other than any IC chip of host 150. For example, memory device 110 may be a packaged device other than any packaged device of host 150. In another embodiment, at least some of system 100 is a stack of integrated circuit (IC) chips. In still another embodiment, system 100 is a system-on-chip (SoC) device. Although some embodiments are not limited in this regard, system 100 may further comprise or couple to one or more other resources (such as the illustrative repository 153 shown) which, for example, facilitate relatively long-term data storage. By way of illustration and not limitation, repository 153 may include a solid state drive (SSD), hard disk drive (HDD) or the like.

Interconnect 140 may comprise signal lines to variously exchange signaling between host 150 and memory device 110. For example, interconnect 140 may include a data bus, an address bus, a command bus and/or any of a variety of combinations of some or all such buses in support of host 150 accessing or otherwise controlling memory device 110. Interconnect 140 may further include one or more control signal lines for control signaling (e.g., other than command, address and/or data signaling) to memory device 110. A reader of skill in the art will appreciate that such control signal lines may communicate, for example, one or more of a chip select signal, a write enable signal, an output enable signal, a clock signal, a column address strobe signal, a row address strobe signal or any of a variety of other conventional control signals. As discussed herein, one or more control signals lines of interconnect 140 may indicate (explicitly or implicitly) that an in-memory compute operation is to be performed at memory device 110 based on data which is stored at a local array of memory cells.

Memory device 110 may include any of a variety of types of memory technology wherein memory cells are arranged in rows and columns—e.g., where data stored by said cells is accessible via word lines and bit lines, or an equivalent thereof. In one embodiment, memory device 110 includes static random-access memory (or "SRAM"). However, any of various additional or alternative types of memory cell technologies may be adapted, as described herein. In the example embodiment shown, memory device 110 includes an array 120 of memory cells (or "memory array"), which represents one or more logical and/or physical groups of memory. An example of one such grouping of memory is a bank of memory resources that, for example, may include storage elements arranged in rows and columns.

To facilitate an efficient provisioning of data for use in an in-memory computation, memory device 110 may further comprise another array 130 of memory cells. As described herein, memory cells of array 120 may be arranged in a first plane—e.g., where memory cells of array 130 are arranged in a second plane which is parallel to a first plane, and where array 130 is offset from array 120 in a direction which is orthogonal to said planes. Along such an orthogonal direction, arrays 120, 130 may overlap one another, for example. In some embodiments, one or more metallization layers of an IC chip may be disposed between memory cells of array 120 and memory cells of array 130. For example, an IC chip stack of system 100 may comprise both a first IC chip which includes array 120, and a second IC chip which includes array 130. In such an embodiment, through-silicon vias (TSVs) may facilitate coupling of arrays 120, 130 to each other. Alternatively, array 120 and array 130 may be variously integrated in or on the same single IC chip. Array 130 may include cells of embedded dynamic random-access memory ("embedded DRAM", or "eDRAM"), for example.

However, some embodiments are not limited to one or either of arrays 120, 130 having a particular memory cell technology.

Memory device 110 may include access logic 112 to facilitate, at least in part, access to arrays 120, 130—e.g. where such access is provided for servicing one or more commands from host 150. In the example embodiment shown, access logic 112 is coupled to array 120 via an interconnect 121 and is further coupled to array 130 via another interconnect 131. Interconnects 121, 131 may each include a respective one or more signal lines to variously operate arrays 120, 130 (respectively) to facilitate reads, writes and/or other memory access operations. Interconnect 131 may include via structures (such as vias of a metal stack and/or through silicon via structures, for example) which extend vertically above—or alternatively below—memory array 120. Access logic 112 may include, or operate in conjunction with, logic of memory device 110 which provides memory resource access according to conventional techniques. By way of illustration and not limitation, access logic 112 may include or couple to command logic and address logic which is used to decode an access instruction to the proper memory location within one of arrays 120, 130. Command logic and address logic may be implemented, for example, with a state machine or other such circuitry.

During operation of system 100, host 150 may send commands or instructions to memory device 110 over a bus of interconnect 140. Such commands may be interpreted by memory device 110—e.g. including memory device 110 decoding command information to perform a variety of access functions within the memory and/or decoding address information with column logic and/or row logic. For example, such logic may access a specific location in a given array (e.g., one of arrays 120, 130) with a combination of a column address strobe or signal (CAS) and a row address strobe or signal (RAS). Rows of memory may be implemented in accordance with known memory architectures or their derivatives. Briefly, a row of the given array may include one or more addressable columns of memory cells, as identified by the CAS generated by column logic of memory device 110. The rows may each be variously addressable via the RAS generated by row logic of memory device 110. A protocol used for such communication between host 150 and memory device 110 may be supported with a state machine or other such circuitry of memory device 110 (such as the illustrative microcontroller μC 113 shown)—e.g., where at least some of said communications are sent according to one or more conventional techniques. By way of illustration and not limitation, μC 113 may supplement otherwise conventional command/address signaling functionality which, for example, conforms to some or all requirements of a dual data rate (DDR) specification such as the DDR3 SDRAM JEDEC Standard JESD79-3C, April 2008 or the like.

In an embodiment, memory device 110 further comprises circuitry IMCO 122 to perform one or more in-memory compute operations based on data bits which are stored at array 120. As described herein, IMCO 122 may comprise any of various types of Boolean circuit logic to receive input signaling based on data stored in array 120. Such Boolean circuitry may comprise one or more NOT gates and/or combinatorial logic (e.g., including an AND gate, OR gate, NAND gate, NOR gate, XOR gate and/or the like), in various embodiments. In-memory computing with IMCO 122 may be based on signaling at one or more data lines (e.g., one or more bit lines or one or more word lines) of array 120—e.g., wherein such signaling includes a first signal indicating a first logic state which is based on a first stored data bit value and, in some embodiments, further includes a second signal indicating a second logic state which is based on a second stored data bit value. Based on such signaling, the Boolean circuitry may generate an output signal which represents or otherwise indicates an at least partial result of a computation using said logic state(s). The one or more Boolean operations may implement an addition of data bit values, a multiplication of data bit values, and/or any of a variety of other such bit operations, which are not limiting on some embodiments. Based on the output signal, array 120 may be operated—e.g., in combination with access logic 112—to store one or more data bit values which represent a result of an in-memory computation by IMCO 122.

In one example scenario, operation of memory device 110 stores to array 130 some data which has been provided by host 150 via interconnect 140. Subsequently, some or all of such data may be copied, moved or otherwise communicated from array 130 to array 120 for storage therein—e.g., wherein said communication from array 130 to array 120 is entirely internal to memory device 110 (or otherwise omits interconnect 140 and host 150). The stored data at array 120 may subsequently be used in an in-memory computation with IMCO 122. Accordingly, array 130 may facilitate a time-efficient and/or power efficient retrieval of data which is to be used in in-memory computations. Such data may include weight values to be used in data convolution and/or other neural network processes, for example. Although some embodiments are not limited in this regard, one or more such weight values may be stored once to array 130, and then successively copied from array 130 to array 120 multiple times over a given period.

IO interface 111 may comprise any of a variety of conductive contacts (such as metal pins, pads, balls, bumps or the like) by which memory device 110 is to be coupled at interconnect 140. Alternatively, or in addition, IO interface may comprise any of a variety of suitable receiver circuitry and/or transmitter circuitry—e.g., adapted from conventional transmitter/receiver architectures—to facilitate communication via interconnect 140. In one embodiment, interconnect 140 includes both a first bus to communicate instructions for accessing array 120, and a second bus to communicate instructions for accessing array 130. Alternatively, interconnect 140 may include at least one shared bus which, at different times, is to variously communicate (with the same signal lines thereof) both instructions to access array 120 and instructions to access array 130. In such an embodiment, the targeting of array 120 or array 130 by a given instruction may be indicated by an address value of the instruction, a timing of the instruction, a control signal (e.g., an enable signal) communicated in association with the instruction, and/or any of various other such techniques or mechanisms. The resolving of such targeting may be performed with access logic 112 or other suitably preconfigured circuitry of memory device 110.

Access logic 112 may comprise, for at least one of arrays 120, 130, a respective column decoder circuit to access a column of memory cells—e.g. by operating one or more bit lines of the at least one memory array. For that same one, or both, of arrays 120, 130, access logic 112 may further comprise a respective row decoder circuit to access a row of memory cells—e.g. by operating a word line of the at least one memory array. In some embodiments, access logic 112 comprises a first column decoder and a first row decoder each to access array 120—e.g., wherein access logic 112 further comprises a second column decoder and a second row decoder each to access array 130. Alternatively, at least some column decoder circuitry and/or at least some row decoder circuitry of access logic 112 may be configured to variously facilitate access to either one of both of array 120, 130 at different times. Sense amplifier circuitry, driver circuitry, pre-charge circuitry and/or other such access logic may also be similarly dedicated to a particular one of arrays 120, 130 or—alternatively—shared for use in accessing either of arrays 120, 130.

To facilitate the providing of data for use in an in-memory computation, memory device 110 may further comprise logic (such as the illustrative configuration circuitry CFG 114 shown) which is to configure any of a plurality of operational modes each for variously accessing a respective one or more of arrays 120, 130. For example, CFG 114 may comprise one or more switches, multiplexers, demultiplexers and/or other circuitry to variously enable or disable, selectively, one or more conductive paths in memory device 110. The plurality of modes may include a mode to store to array 130 data which memory device 110 has received from an external agent such as host 150. The plurality of modes may further comprise one or both of a mode to communicate data from array 130 for storage at array 120, or a mode to perform an in-memory computation with IMCO 122.

Configuration of a given mode of memory device 110 may include CFG 114 selectively enabling, or disabling, any of a variety of types of communication including, but not limited to, communication between IO interface 111 and interconnect 140, communication between circuitry of access logic 112 and circuitry of IO interface 111, communication between memory array 120 and IMCO 122, and/or communication between memory array 120 and access logic 112. Such types of communication may further comprise, for example, communication between circuitry of IO interface 111 which facilitates access to array 120, and other circuitry of IO interface 111 which facilitates access to array 130. Alternatively, or in addition, CFG 114 may selectively enable, or disable, communication between circuitry of access logic 112 which is to access array 120, and other circuitry of access logic 112 which is to access array 130.

A given mode of memory device 110 may be configured, for example, in response to some state machine or other control circuitry (e.g., μC 113) detecting an instance of a trigger condition for particular memory access operation. For example, μC 113 may be preconfigured to implement—with CFG 114—a mode for a next operation in a predefined sequence of memory access operations (e.g., a next data transfer in a sequence of multiple data transfers). In some embodiments, the configuration of a given mode by CFG 114 is automatic—i.e., where "automatic" in this context refers to CFG 114 operating independent of any explicit instruction from host 150 for memory device 110 to configure said mode. Alternatively, MC 152 may provide one or more instructions which cause memory device 110 to configure a corresponding mode.

Figure 1B:
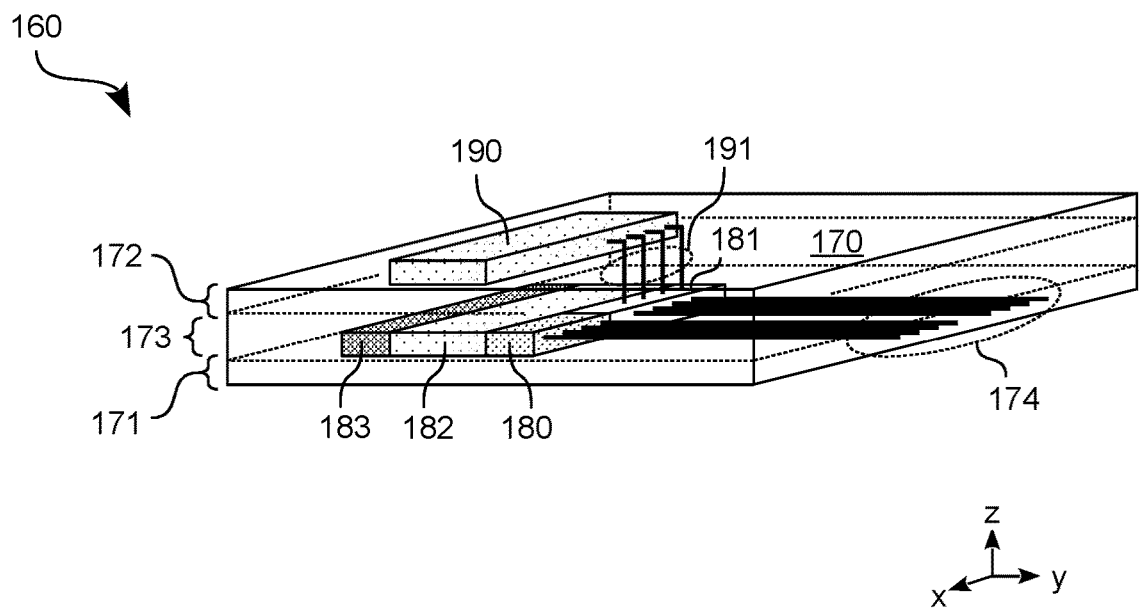
FIG. 1B is a perspective view diagram illustrating elements of a device to provide data for an in-memory computation according to an embodiment.

FIG. 1B shows features of a device 160 to perform an in-memory computation according to an embodiment. Device 160 is one example of an embodiment wherein IO logic of a memory device is operable to provide external host logic with access to two memory arrays which each extend in a respective (horizontal) plane. One of said arrays—e.g., offset (vertically) from another of said arrays—is to provide data to the other array in preparation for use in an in-memory computation. Device 160 may include some or all of the features of memory device 110, for example.

As shown in FIG. 1B, device 160 includes a memory device, circuitry of which is variously disposed in or on one or more IC chips 170. Such circuitry may comprise memory arrays 182, 190 which, for example, correspond functionally to arrays 120, 130 (respectively). An interconnect 174—such as interconnect 140—may be coupled to enable communication between the memory device and a host (not shown) that is disposed in—or alternatively, is to couple to—the one or more IC chips 170.

A region 171 of the one or more IC chips 170 includes array 182—e.g., where the region 171 extends along a first plane in parallel with the x-y plane shown. Another region 172 of the one or more IC chips 170—the region 172 extending along a second plane which is parallel to the first plane—may include array 190. The first plane and the second plane may be offset from one another along a dimension (such as the z-axis shown) which is orthogonal to the first plane. Along this dimension, arrays 182, 190 may overlap one another at least in part.

Region 171 may further comprise circuitry to variously access memory cells of array 182. For example, the memory device may comprise circuitry 180 which provides command and/or address decode functionality (such as that of access logic 112) to access array 182. Other circuitry 181 of the memory device (or in some embodiments, some or all of circuitry 180) may provide similar functionality to access array 190.

In such an embodiment, memory array 182 may be further coupled to circuitry 183 of the memory device—e.g., the circuitry 183 providing functionality of IMCO 122—which is to perform an in-memory computation based on data provided to array 182 from array 190. For example, an interconnect 191, comprising one or more via structures, may be coupled to enable circuitry 181 to variously access word lines and bit lines of array 190. Other interconnect structures (not shown) of the memory device may further facilitate data communication between memory arrays 190, 182—e.g., where such communication is via circuitry 181 and/or circuitry 180. Another region 173 of one or more IC chips 170 (the region 173 disposed between regions 171, 172) may include one or more dielectric layers to provide at least some electrical isolation between arrays 182, 190. Region 173 may further comprise one or more metallization layers which extend between arrays 182, 190. In an embodiment wherein device 160 comprises an IC die stack, region 173 may include other structures (e.g., a semiconductor substrate material, micro-bumps, and/or the like) between arrays 182, 190.

FIG. 2 shows features of a method 200 to communicate data for use in an in-memory computation according to an embodiment. Method 200 is one example of an embodiment wherein a first memory array, to facilitate in-memory computation, communicates data to a second memory array which is offset vertically from the first memory array. Method 200 may be performed with memory device 110 or device 160, for example.

As shown in FIG. 2, method 200 includes (at 201) receiving first data from a memory controller coupled to the memory device. For example, the receiving at 201 may comprise IO interface 111 receiving via interconnect 140 one or more instructions to write data to array 130. Method 200 may further comprise (at 202) storing the first data to a first array of memory cells of the memory device. Such storing may be performed with circuitry which provides some or all functionality of access logic 112—e.g., wherein the storing includes performing address decode operations for operating word lines and/or bit lines of the first array.

After the storing at 202, method 200 may communicate the first data (at 203) from the first array to a second array of memory cells of the memory device—e.g., wherein the second array corresponds functionally to array 120. Respective rows and columns of the first array and the second array may each extend in parallel with a first plane, wherein the first array is offset from the second array in a direction orthogonal to the first plane. Such a configuration of memory arrays is illustrated by device 160, for example. In one such embodiment, storing the first data to the first array at 202 comprises decoding an address of a memory location at the first array, wherein the decoding is performed with circuitry of the memory device which, along with the second array, extends in the first plane.

In various embodiments, a first integrated circuit die comprises the first array and the second array—e.g., where the first array comprises embedded dynamic random access memory (eDRAM) cells, and wherein the second array comprises static random access memory (SRAM) cells. However, various embodiments are not limited to a particular type of memory cell of the first array or the second array. Alternatively, a die stack may comprise a first IC die which includes the first array, and a second IC die which includes the second array. In such an embodiment, through-silicon vias of the memory device may be variously coupled between the first array and the second array—e.g., via access circuitry which operates said array. For example, the storing of the first data to the first array at 202 may comprise decoding an address of a memory location at the first array, wherein the decoding is performed by access circuitry of the second IC die.

Although some embodiments are not limited in this regard, communicating the first data from the first array to the second array at 203 may be in response to control circuitry of the memory device detecting one or more conditions local to the memory device. For example, such one or more conditions may include a completion of another data computation performed at IMCO circuitry of the memory device, a completion of a read from the second array, a completion of a write to the first array, or an expiration of a predefined time duration (after detection of some associated memory access event).

Communicating the first data from the first array to the second array at 203 may comprise, for example, automatically performing successive writes each to a different respective row of the second memory array. Such successive writes may be performed according to a data transfer sequence which is predefined at the memory device—e.g., the performing independent of any series of instructions from the memory controller to explicitly specify the sequence.

In an embodiment, method 200 further comprises (at 204) communicating from the second array to first circuitry of the memory device—such as to IMCO 122—a first signal indicating a logic state based on a bit of the first data. Method 200 may further comprise (at 205) the first circuitry performing a data computation based on the first signal. A result of the data computation may subsequently be stored at the second array, as illustrated at operation 206 of method 200. In various embodiments, the first signal is based on only one stored bit or, alternatively based on an access of two (or more) data bits stored at the second array. As described herein, the logic state may (for example) be an equivalent of an ANDing of two of more stored bits. In one such embodiment, method 200 may further comprise an operation (not shown) which communicates, from the second array to the first circuitry, a second signal indicating another logic state based on the two or more stored data bits, wherein performing the data computation is further based on the second signal.

Figure 3A:
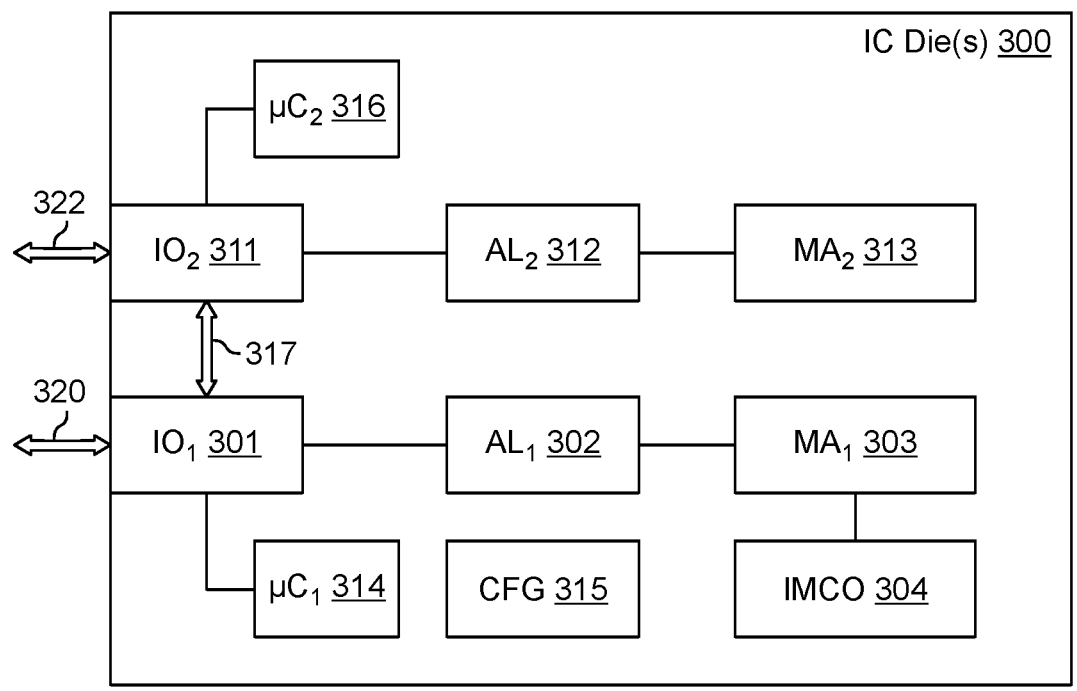
FIGS. 3A and 3B are functional block diagrams each illustrating elements of a respective memory device to communicate data between memory arrays according to a corresponding embodiment.

FIG. 3A shows features of a memory device 300 to provide data for an in-memory computation according to an embodiment. Memory device 300 may perform method 200 and/or include features of memory device 110 or device 160, for example. As shown in FIG. 3A, memory device 300 comprises memory arrays $MA_1$ 303, $MA_2$ 313 which, for example, correspond functionally to arrays 120, 130 (respectively). In such an embodiment, IO circuitry $IO_1$ 301 and IO circuitry $IO_2$ 311 of memory device 300 may be variously configured to provide input/output functionality such as that of IO interface 111.

Memory device 300 may further comprise circuitry $AL_1$ 302 and circuitry $AL_2$ 312 which, for example, are to provide memory access functionality such as that of access logic 112. By way of illustration and not limitation, $AL_1$ 302 may comprise a first column decoder and first row decoder to variously operate bit lines and word lines (respectively) of $MA_1$ 303. $AL_1$ 302 may further comprise sense amplifiers, driver circuits, pre-charge circuits and/or other such circuitry to enable data writes to and/or data reads from $MA_1$ 303. Similarly, $AL_2$ 312 may comprise a second column decoder and second row decoder (and in some embodiments, sense amplifiers, driver circuits, pre-charge circuits and/or the like) to variously communicate signals with memory cells of $MA_2$ 313.

In the example embodiment shown, circuitry $IO_1$ 301 enables coupling of memory device 300 to an interconnect 320—e.g., to exchange with external host logic (not shown) communications which facilitate access to $MA_1$ 303 using $AL_1$ 302. By contrast, circuitry $IO_2$ 311 may couple memory device 300 to another interconnect 322 for exchanging other communications which facilitate access to $MA_2$ 313 using $AL_2$ 312. To facilitate communication within memory device 300, circuitry $IO_1$ 301 and circuitry $IO_2$ 311 may each further comprise respective IO interfaces with an interconnect 317 of memory device 300—e.g., wherein circuitry $IO_1$ 301 and circuitry $IO_2$ 311 are variously (re)configurable to communicate with each other or, alternatively, with an external host.

Memory device 300 further comprises circuitry IMCO 304 (e.g., IMCO 122) which is coupled to perform in-memory computation based on data stored at $MA_1$ 303. To facilitate such in-memory computation, data may be stored $MA_2$ 313 in advance—e.g., where $MA_2$ 313 is offset orthogonally from a plane in which $MA_1$ 303 extends. Such data may be available for fast and/or power efficient transfer from $MA_2$ 313 to $MA_1$ 303 and, subsequently, for use in data computing by IMCO 304. In an embodiment, configuration circuitry CFG 315 of memory device 300 (e.g., providing functionality of CFG 114) may configure, at different times, any of a plurality of modes to variously communicate such data.

For example, a first such mode may facilitate a data write to $MA_2$ 313, wherein one or more signal paths are enabled for communication between circuitry $IO_2$ 311 and interconnect 322. Such a first mode may further comprise a disabling of one or more signal paths which are otherwise for communication between circuitry $IO_1$ 301 and circuitry $IO_2$ 311—e.g., via the illustrative interconnect 317 shown. Furthermore, a second mode configured with CFG 315 may enable a communication of data from $MA_2$ 313 to $MA_1$ 303—e.g., wherein communication between circuitry $IO_1$ 301 and circuitry $IO_2$ 311 via interconnect 317 is enabled. Although some embodiments are not limited in this regard, such a second mode may further include a disabling of communication by circuitry $IO_1$ 301 via interconnect 320 and/or a disabling of communication by circuitry $IO_2$ 311 via interconnect 322. Further still, a third mode may enable the performance of an in-memory computation based on data which is stored at $MA_1$ 303—e.g., wherein the third mode enables communication between $MA_1$ 303 and IMCO 304. In such an embodiment, the third mode may disable communication between circuitry $IO_1$ 301 and $AL_1$ 302, for example.

Operation of CFG 315 to variously configure some or all such modes may be in response to a state machine or other control circuitry of memory device 300 (e.g., including one or both of the illustrative microcontroller logic $\mu C_1$ 314 and microcontroller logic $\mu C_2$ 316 shown). For example, $\mu C_1$ 314 and/or $\mu C_2$ 316 may detect an instance of one or more states which, according to a pre-configuration of memory device 300, are a condition for enabling and/or performing some associated data communication. By way of illustration and not limitation, $\mu C_1$ 314 and/or $\mu C_2$ 316 may detect one of a completion of a write to $MA_2$ 313, a completion of a data communication from $MA_2$ 313 to $MA_1$ 303, or a completion of an in-memory computation by IMCO 304 (e.g., including the storing of a computation result to $MA_1$ 303). Alternatively, or in addition, $\mu C_1$ 314 and/or $\mu C_2$ 316 may detect an explicit command from an external host to configure a given mode or to perform a particular data communication which requires said mode.

In response to the detecting, $\mu C_1$ 314 and/or $\mu C_2$ 316 may signal CFG 315 to configure a particular mode which facilitates a data communication to be performed. For example, $\mu C_1$ 314 and/or $\mu C_2$ 316 may include or otherwise have access to state information which indicate a predefined sequence of multiple data communications. The state information may specify or otherwise indicate a correspondence of addressable locations in $MA_2$ 313 each with a different respective addressable location in $MA_1$ 303. In such an embodiment, the state information may further indicate an order in which data stored at such addressable locations in $MA_2$ 313 is to be moved, copied or otherwise communicated to the corresponding addressable locations in $MA_1$ 303. Based on the state information, memory device 300 may implement such a predefined sequence automatically—e.g., without requiring an external host to communicate multiple memory access instructions which specify the sequence. For example, one or both of $\mu C_1$ 314 or $\mu C_2$ 316 may support functionality—e.g., adapted from conventional direct memory access (DMA) techniques—to communicate, entirely within memory device 300, data read instructions and/or data write instructions which facilitate a communication of data from $MA_2$ 313 to $MA_1$ 303.

Figure 3B:
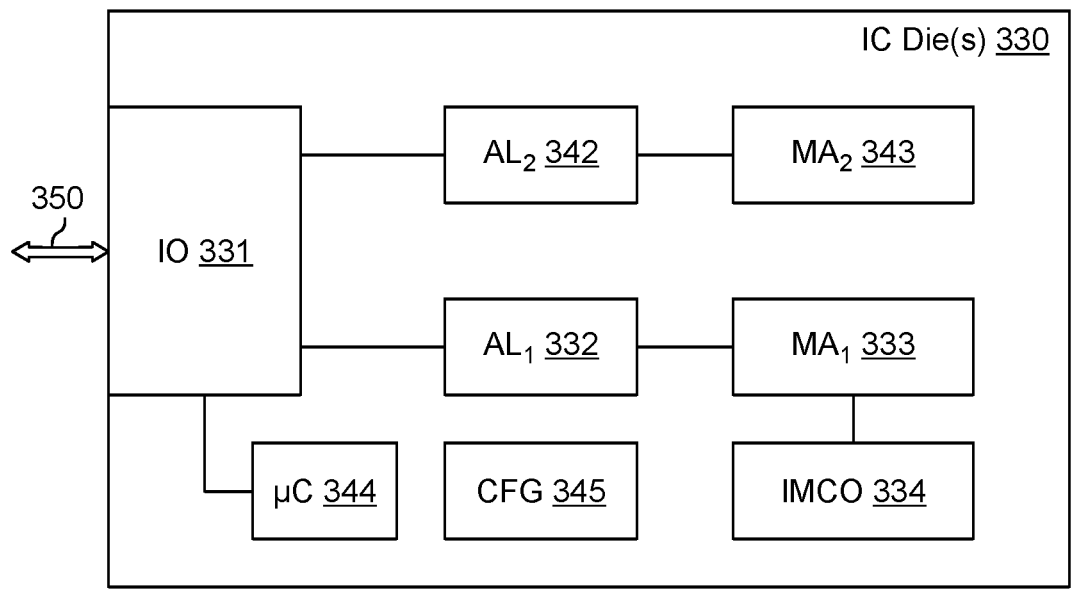

FIG. 3B shows features of a memory device 330 to provide data for an in-memory computation according to another embodiment. Memory device 330 may perform method 200 and/or include features of memory device 110 or device 160, for example. As shown in FIG. 3B, memory device 330 comprises memory arrays $MA_1$ 333, $MA_2$ 343 which correspond functionally to arrays $MA_1$ 303, $MA_2$ 313 (respectively). Memory device 330 further comprises circuitry $AL_1$ 332 and circuitry $AL_2$ 342 which, for example, provide the respective memory access functionality of $AL_1$ 302 and $AL_2$ 312. Circuitry IMCO 334 of memory device 330 (e.g., providing functionality of IMCO 304) may be coupled to perform in-memory computation based on data stored at $MA_1$ 333.

In such an embodiment, circuitry IO 331 of memory device 330 provides input/output functionality such as that of IO interface 111. Circuit structures of IO 331 enable coupling of memory device 330 to an external host logic (not shown) via an interconnect 350 for communications which, at different times, facilitate access to $MA_1$ 333 using $AL_1$ 332 or access to $MA_2$ 343 using $AL_2$ 342. For example, circuitry of IO 331 may variously multiplex or otherwise transition between different modes for variously accessing $MA_1$ 333 via $AL_1$ 332 or accessing $MA_2$ 343 via $AL_2$ 342.

Configuration circuitry CFG 345 of memory device 330 (e.g., providing functionality of CFG 315) may configure, at different times, any of a plurality of modes which are variously to store data to $MA_1$ 333, to communicate data between $MA_1$ 333 and $MA_2$ 343, to communicate data between $MA_2$ 343 and IMCO 334, to communicate a result of an in-memory computation from $MA_2$ 343 (e.g., from memory device 300) or the like. Operation of CFG 345 to variously configure some or all such modes may be in response to control circuitry of memory device 330, such as the illustrative microcontroller logic $\mu C$ 344 shown. In some embodiments, $\mu C$ 344 and CFG 345 operate to bypass or otherwise disable transmitter and/or other circuitry (not shown) of IO 331—e.g., wherein $\mu C$ 344 provides, via other circuitry of IO 331, signals for $AL_1$ 332 and $AL_2$ 342 to implement a communication of data from $MA_2$ 343 to $MA_1$ 333. In such an embodiment, memory cells of $MA_2$ 343 may be offset vertically from a plane in which $MA_1$ 333 extends—e.g., wherein some or all IO circuitry, access logic, and in-memory computation circuitry of memory device 300 also extends in said plane.

Figure 4:
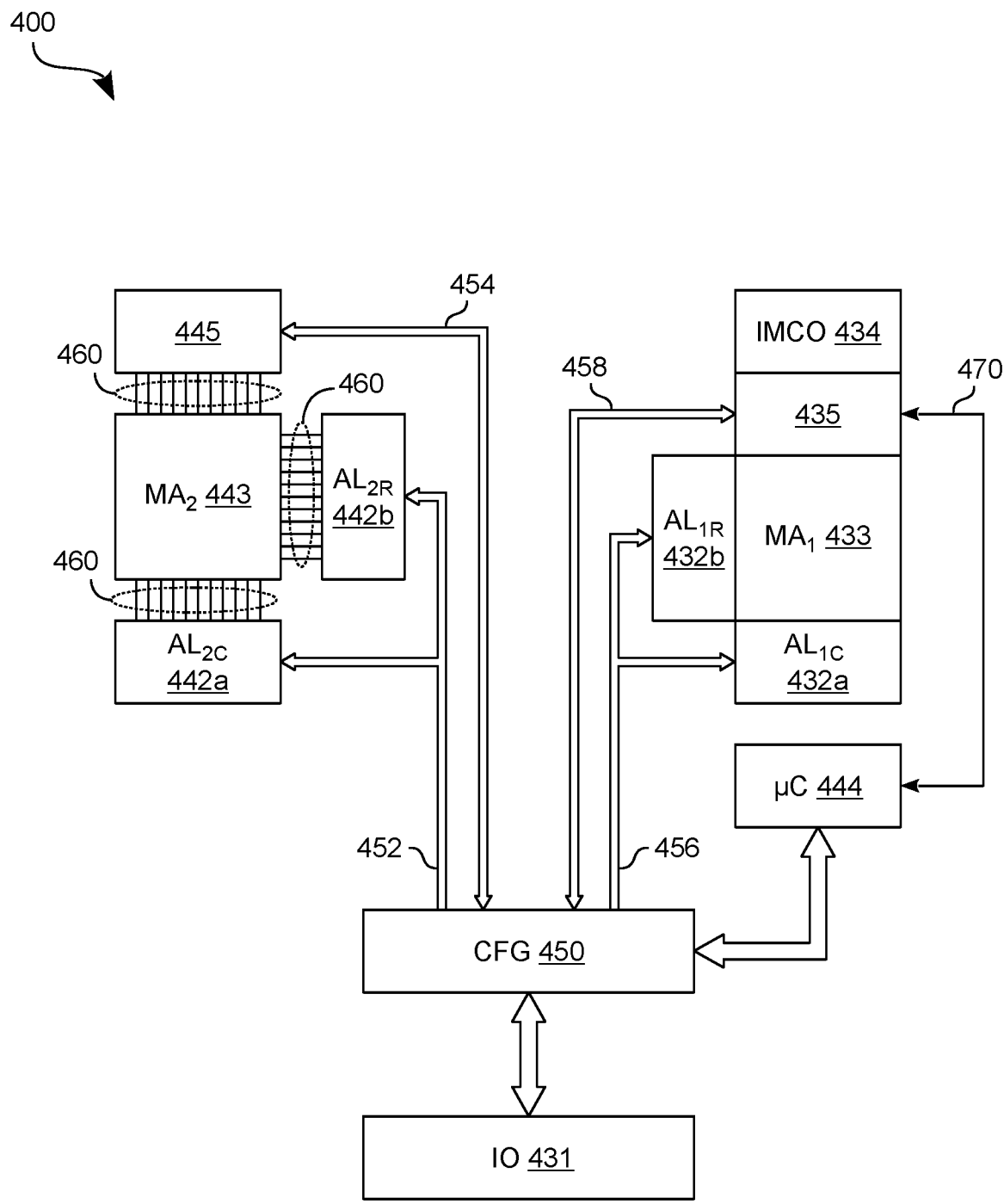
FIG. 4 is a functional block diagram illustrating elements of a device to perform an in-memory computation according to an embodiment.

FIG. 4 shows features of a device 400 to perform in-memory computation according to another embodiment. Device 400 is one example of an embodiment wherein IO logic, in a first horizontal layer of one or more IC chips, is operable to provide host logic with access to two memory arrays. One of said memory arrays—e.g., offset vertically from another of said offset arrays—is to provide said other array data for use in an in-memory computation. Device 400 may include features of memory device 330, for example.

As shown in FIG. 4, memory device 400 comprises memory arrays $MA_1$ 433, $MA_2$ 443 which correspond functionally to arrays $MA_1$ 333, $MA_2$ 343 (respectively). Memory device 400 further comprises first access circuitry which, for example, provides functionality of $AL_1$ 332. Such first access circuitry may comprise a column decoder $AL_{1C}$ 432a, a row decoder $AL_{1R}$ 432b and circuitry 435 which, for example, includes one or more sense amplifiers, driver circuits, and/or other logic to variously communicate signals with bit lines of $MA_1$ 433. In an embodiment, circuitry 435 is configurable to transition between one mode for communicating data between $MA_1$ 433 and circuitry IMCO 434 (e.g., IMCO 334), and another mode for communicating data between $MA_1$ 433 and input/output circuitry IO 431. IMCO 434 may perform one or more in-memory computations based on data stored at $MA_1$ 433—e.g., wherein a result of such one or more in-memory computations is to be communicated back through circuitry 435 and stored at $MA_1$ 433. Input/output circuitry IO 431 (e.g., providing functionality of IO 331) may facilitate coupling of memory device 400 to an external host—e.g., where IO 431 includes transmitter/receiver circuitry for communications to access either of $MA_1$ 333 or $MA_2$ 343.

Memory device 400 may further comprise second access circuitry which, for example, provides functionality of $AL_2$ 342. Such second access circuitry may comprise a column decoder $AL_{2C}$ 442a, a row decoder $AL_{2R}$ 442b and circuitry 445 which, for example, comprises one or more sense amplifiers, driver circuits, and/or other logic to variously communicate signals with bit lines of $MA_2$ 443. In one such embodiment, via structures provide interconnection between $MA_2$ 443 and other circuitry of memory device 300 (e.g., where such other circuitry includes at least $MA_1$ 433). For example, vias 460 may be coupled between memory cells of $MA_1$ 433 and some or all of the second access circuitry which comprises $AL_{2C}$ 442a, $AL_{2R}$ 442b and circuitry 445. Accordingly, $MA_2$ 443 may be offset vertically from $MA_1$ 433 and some or all such second access circuitry.

During operation of memory device 400, data from a host may be communicated from IO 431 for storage at $MA_2$ 443—e.g., wherein control signaling 452 and data signaling 454 is provided, via configuration circuitry CFG 450, to variously operate $AL_{2C}$ 442a, $AL_{2R}$ 442b and circuitry 445. To facilitate an in-memory computation, some or all such data may be subsequently communicated from $MA_2$ 443 for storage at $MA_1$ 433. For example, control logic of memory device 400 (such as the illustrative microcontroller circuit μC 444 shown) may signal CFG 450 to configure a mode which enables communication between the first access circuitry and the second access circuitry. Writing of the data to $MA_1$ 433 may be performed with control signaling 456 and data signaling 458 which is provided to variously operate $AL_{1C}$ 432a, a row decoder $AL_{1R}$ 432b and circuitry 435. After $MA_1$ 433 has stored such data from $MA_2$ 443, μC 444 (or other suitable circuitry) may provide a control signal 470 for circuitry 435 to configure a mode which enables communication of such data to IMCO 434. Based on such data, IMCO 434 may perform one or more in-memory computations—e.g., wherein a result of such one or more in-memory computations is written back to $MA_1$ 433.

Figure 5:
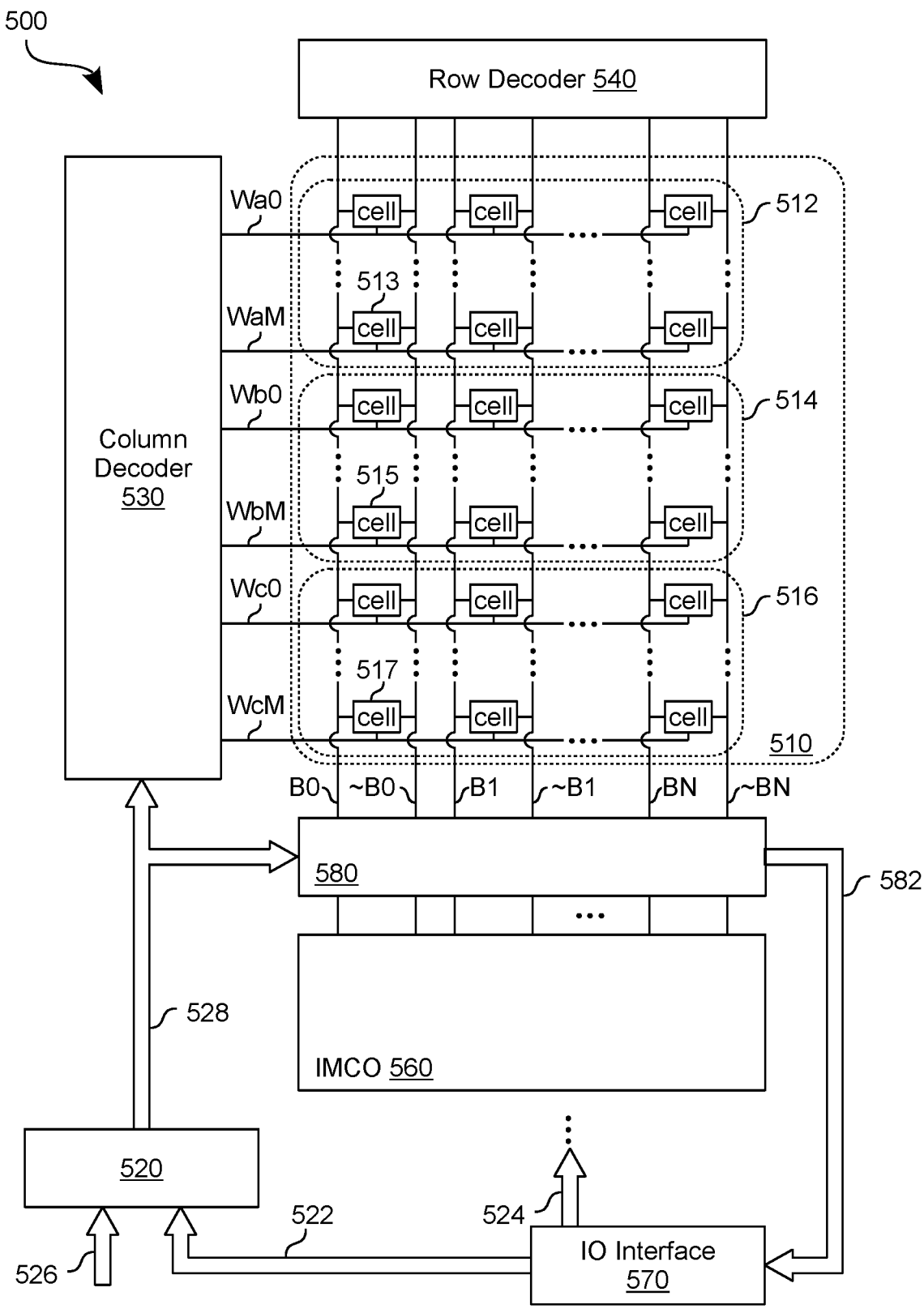
FIG. 5 is a functional block diagram illustrating elements of a device to perform an in-memory computation according to an embodiment.

FIG. 5 shows features of a device 500 to provide data for in-memory compute operations according to another embodiment. Device 500 may include features of one of memory devices 110, 300, for example, and/or may perform some or all of method 200.

As shown in FIG. 5, device 500 comprises a memory array 510 which, for example, corresponds functionally to one of arrays 120, $MA_1$ 303, or $MA_1$ 333. IO interface 570 of memory device 500 comprises circuitry to variously couple to, and communicate with, a memory controller or other host logic (not shown). Circuitry of IO interface 570 may provide some or all of the functionality of IO interface 111, for example. Access logic of device 500 (e.g., providing functionality of $AL_1$ 302) includes a column decoder 530 and a row decoder 540 to variously decode address information of a memory access command received in communications via an interconnect 528. Based on such decoding, column decoder 530 and row decoder 540 may variously operate word lines and bit lines to access one or more cells of array 510.

In the example shown, a given column of memory cells in array 510 is to be accessed using a corresponding pair of bit lines (or "line pair")—e.g., where said cells each have a six transistor (6T) memory cell architecture. For example, bit lines of array 510 include a pair of bit lines [B0, ~B0], where the logic state based on a first one or more stored bits may be communicated with bit line B0, while another logic state based on the first one or more stored bits is communicated with bit line ~B0. Similarly, another column of memory cells may be accessed with a corresponding one of line pairs [B1, ~B1], . . . , [BN, ~BN].

In one example scenario, the coupling of multiple cells in the same column to the same bit line—e.g., to bit line B0—may enable said bit line to communicate a signal which represents a logical AND'ing of the respective bits stored by said multiple cells. Concurrently, the complementary bit line—e.g., bit line ~B0—may communicate another signal which represents a logical AND'ing of the opposite states of said bits. For example, array 510 is shown as including a sub-array 512 accessible with word lines Wa0, . . . , WaM, another sub-array 514 accessible with word lines Wb0, . . . , WbM, and another sub-array 516 accessible with word lines Wc0, . . . , WcM. This particular arrangement of subarrays 512, 514, 516 is merely illustrative of one use for device 500, and is not limiting on some embodiments.

In one such embodiment, word lines WaM, WbM (for example) may be concurrently operated to access cells 513, 515 in respective sub-arrays 512, 514—e.g., while cell 513 stores a bit A and cell 515 stores a bit B. As a result of such operating, a voltage level at bit line B0 may indicate a logic level which is equivalent to the AND'ed combination (A·B). By contrast, a concurrent voltage level at bit line ~B0 may indicate a logic level which is equivalent to the AND'ed combination (!A·!B).

Memory device 500 may further include circuitry IMCO 560—e.g., providing functionality of IMCO 122—to perform one or more in-memory compute operations based on such signaling by bit lines B0, ~B0 (and/or signaling by one or more additional or alternative line pairs). Additional circuitry 580, coupled between array 510 and IMCO 560, may provide sense amplifier and/or driver circuitry to variously receive signals from, or provide signals to, respective bit lines of array 510. Furthermore, circuitry 580 may be variously configured to selectively determine whether data signals are to be directed to/from IMCO 560 or to an output path 582 for communication from memory device 500 via IO interface 570. During an in-memory compute mode of device 500, signaling from array 510 may be provided via circuitry 580 to combinatorial logic (not shown) of IMCO 560—e.g., for use in performing one or more in-memory computations. A result of such one or more in-memory computations may be written back to one or more cells of array 510 (including cell 517 in sub-array 516, for example)—e.g., via circuitry 580.

In one example embodiment, one or more cells of sub-array 516 (e.g., including the illustrative cell 516 shown) are to store a result of an in-memory computation which is based both on a first value stored at sub-array 512, and on a second value stored at sub-array 514. However, any of a variety of other in-memory computations and data writes may be performed, in different embodiments.

To facilitate the provisioning of data for use in-memory computation, memory device 500 may further comprise a second memory array (not shown) which, for example, is offset vertically from a horizontal plane in which array 510 extends—e.g., wherein the second array corresponds functionally to $MA_2$ 313. In such an embodiment, an interconnect 522 of memory device 500 may be coupled between IO interface 570 and switch/multiplexer circuitry 520—e.g., wherein another interconnect 524 is coupled between IO interface 570 and other circuitry (not shown)—e.g., such as $AL_2$ 312—which is to provide column decode, row decode, and/or other such functionality to access the second memory array. Moreover, memory device 500 may further comprise an interconnect 526 coupled between switch/multiplexer circuitry 520 and the decode circuitry for accessing the second memory array—e.g., wherein switch/multiplexer circuitry 520 is coupled to selectively provide connectivity between interconnect 528 and either one of interconnects 522, 526.

In an example scenario according to one embodiment, first data may be received at device 500 from a memory controller (not shown) which is coupled thereto via IO interface 570. The first data may be communicated, via IO interface 570 and interconnect 524, to the access logic stores such data in the second memory array. The first data may thus be available for efficient (and in some embodiments, repeated) communication from the second array into array 510. Such communication may take place via interconnect 526, switch/multiplexer circuitry 520 and interconnect 528, for example. After being retrieved from the second memory array and stored to array 510, the first data may be subsequently accessed with IMCO 560 for use in an in-memory computation. Operation of configuration logic (e.g. including switch/multiplexer circuitry 520 and/or circuitry 580) to variously provide an in-memory compute mode and/or one or more other modes of device 500 may be responsive to circuitry (not shown) which provides control functionality such as that of μC 113.

Figure 6:
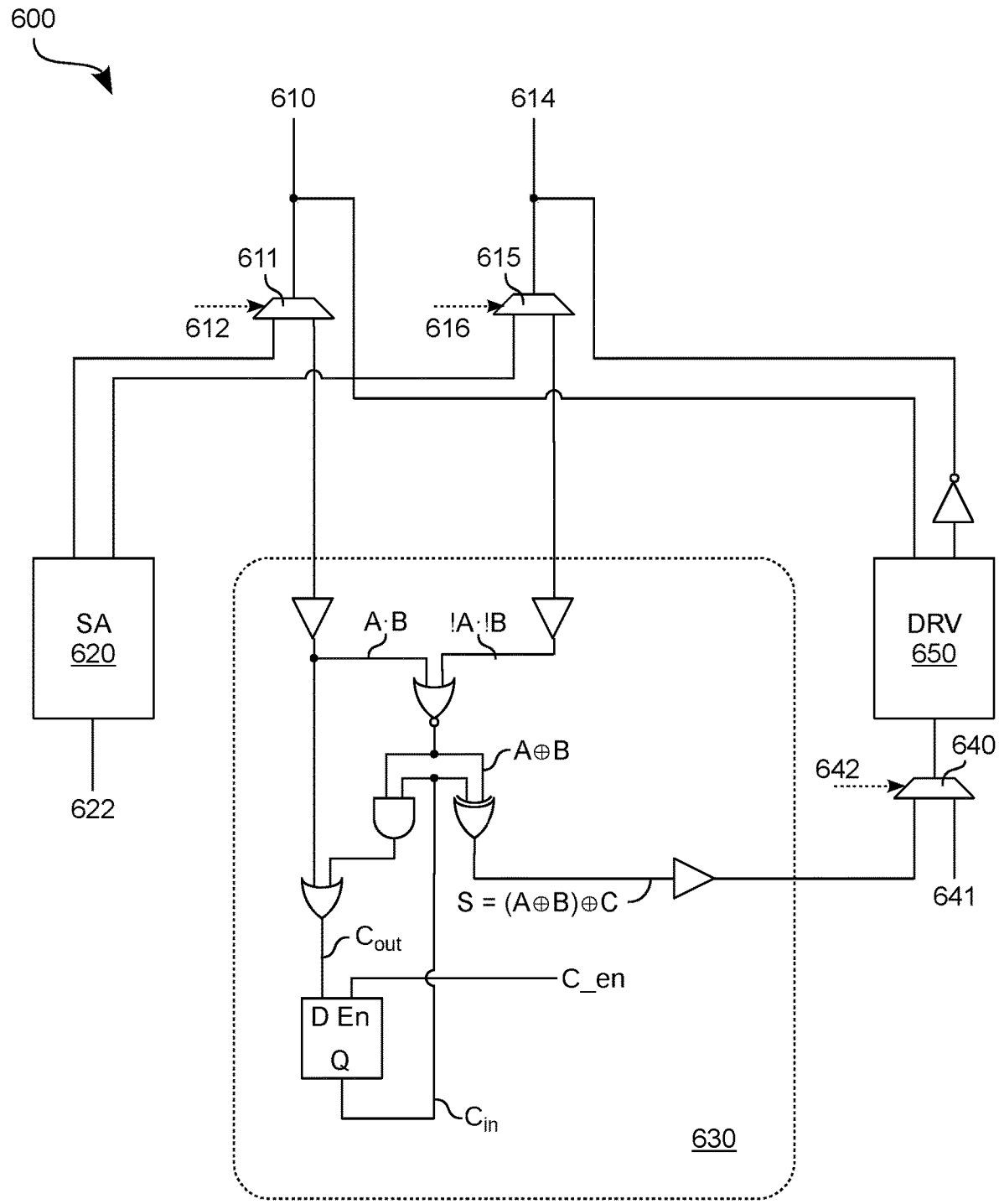
FIG. 6 is a hybrid functional block and circuit diagram illustrating elements of circuitry to communicate data between memory arrays according to an embodiment.

FIG. 6 shows features of a memory device 600 to perform an in-memory computation according to another embodiment. Memory device 600 may include some or all of the features of one of memory devices 110, 300, 400 and/or may be used to perform some or all of method 200.

As shown in FIG. 6, memory device 600 comprises circuitry 630 which (for example) provides functionality of one of IMCO 122, IMCO 304, IMCO 334 or the like. Switch logic of memory device 600 (e.g., including the illustrative demultiplexer DMUX 611, and multiplexer MUX 640 shown) is coupled to selectively enable and/or disable various conductive paths between circuitry 630 and a bit line 610. Similarly, one or more conductive paths between circuitry 630 and another bit line 614 may be variously enabled and/or disabled, selectively, with switch logic such as MUX 640 and another demultiplexer DMUX 615.

With such switch logic, control signals 612, 616, 642 facilitate any one of an in-memory compute mode or one or other modes which support reads from the memory array and/or writes to the memory array. For example, a data read may include sense amplifier circuitry SA 620 of memory device 600 outputting one or more data signals 622 which are based on signaling from bit lines 610, 614—e.g., wherein a data write includes a driver circuitry DRV 650 outputting to one of bit lines 610, 614 a signal which is based on another data signal 641 received by memory device 600. Alternatively, driver circuitry DRV 650 (or other circuitry of memory device 600) may output a result of an in-memory computation.

During an in-memory compute mode of memory device 600, circuitry 630 may receive signals from bit lines 610, 614 via DMUX 611 and DMUX 615 (respectively). For example, bit line 610 may communicate a first signal representing a logic state which is based on a first one or more stored bits—e.g., wherein bit line 614 communicates a second signal representing another logic state based on the first one or more stored bits (or alternatively, based on another one or more stored bits). An in-memory operation on such states may be implemented by combinatorial logic of circuitry 630 which receives the first signal and the second signal.

In the embodiment shown, bit lines 610, 614 are a pair of complementary bit lines (such as line pair B0, ~B0, or line pair B1, ~B1, or line pair BN, ~BN). In one example scenario, a first memory cell storing a bit A may be coupled to each of a first word line and bit lines 610, 614. Similarly, a second memory cell storing a bit B may be coupled to each of a second word line and the bit lines 610, 614. Both the first cell and the second cell may be accessed concurrently using each of the first word line, the second word line, and bit lines 610, 614. Such accessing may result in bit line 610 communicating a first signal which indicates a first logic state based on bits A, B—e.g., where a voltage level of the first signal indicates the equivalent of a logical AND'ing of bits A, B (i.e., the function A·B). Such an AND'ing may be due at least in part to the first memory cell and the second memory cell each being tied to bit line 610. Moreover, the accessing may also result in bit line 614 communicating a second signal which indicates the equivalent of a logical AND'ing of the opposite bit values (i.e., the function !A·!B).

With such signals, combinatorial logic of circuitry 630 may perform an in-memory computation which (for example) adds a first stored value, which includes bit A, and a second stored value, which includes bit B. More particularly, such combinatorial logic may output a value S representing a bit of the arithmetic sum (A+B). Calculation of value S may be further based on a carry bit C_en which, for example, is determined based on a calculation (not shown) of a next less significant bit of said arithmetic sum. Calculation of value S may also result in the determining of another carry bit C_out which, for example, is available for use in the calculation of some next more significant bit (if any) of said arithmetic sum.

Figure 7A:
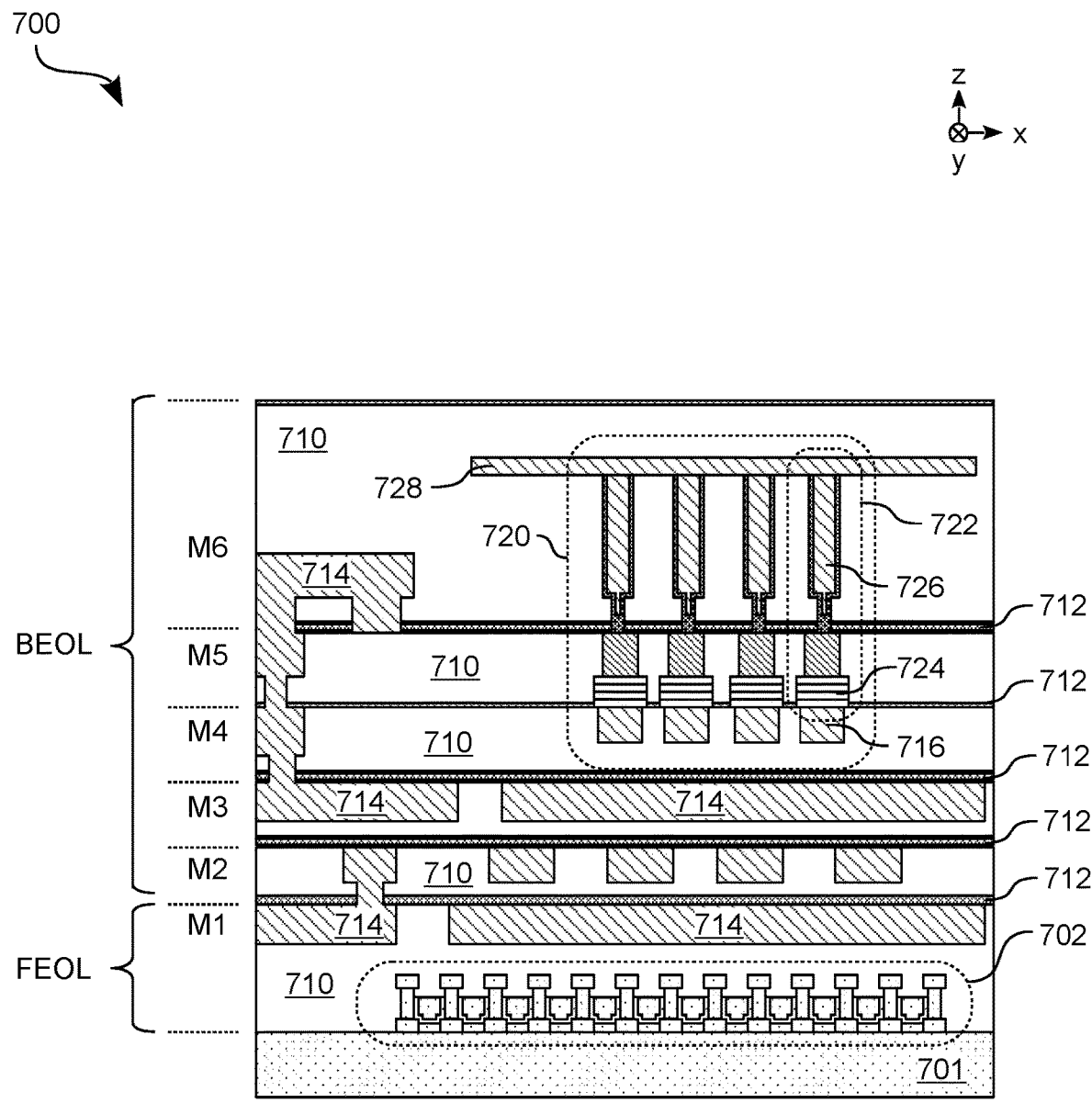
FIGS. 7A and 7B illustrate respective cross-sectional side views each of an integrated circuit chip to perform in-memory computation according to an embodiment.

FIG. 7A shows features of an IC chip 700 comprising a memory device to perform an in-memory computation according to an embodiment. IC chip 700 is one example of an embodiment wherein a memory device includes a stacked arrangement of memory arrays which each extend in parallel with each other, the memory arrays offset from one another in an orthogonal direction. One of said memory arrays is coupled to other circuitry of the memory device which implements an in-memory computation—e.g., where the other of said memory arrays provides efficient access to data used in the in-memory computation. IC chip 700 may include features of memory device 110, for example. In another embodiment, such a memory device is provided with a stack of IC dies—e.g., wherein the memory arrays are each disposed in a different respective IC die of the stack.

As shown in FIG. 7A, IC chip 700 includes a semiconductor substrate 701, wherein circuitry of the memory device—in a front-end-of-line (FEOL) region on semiconductor substrate 701—includes an array 702 of memory cells. Such circuitry in the FEOL may further comprise some or all of access logic, IO circuitry, controller circuitry and/or configuration logic to facilitate access to array 702. Such circuitry in the FEOL may further facilitate access to another memory array 720 of the memory device—e.g., wherein memory array 720 is offset from a plane (e.g., "vertically" offset, along a z-axis, from a "horizontal" x-y plane) in which array 702 extends. For example, a metallization stack in a back-end-of-line (BEOL) region of IC chip 700 may include metallization layers M1-M6 which are variously patterned each in or on a respective one of dielectric layers 710—e.g., wherein other layers 712 (e.g., including seal layers, etch stop layers, or the like) are variously disposed each between a respective to of metallization layers M1-M6. Interconnect structures 714 of metallization layers M1-M6 may include vias which variously extend vertically between respective metallization layers. Some or all such vias may be variously coupled between arrays 702, 720. In the example shown, memory array 720 has a one-transistor, one-capacitor (1T-1C) architecture. However, memory array 720 include any of a variety of other memory cell designs, in other embodiments.

Figure 7B:
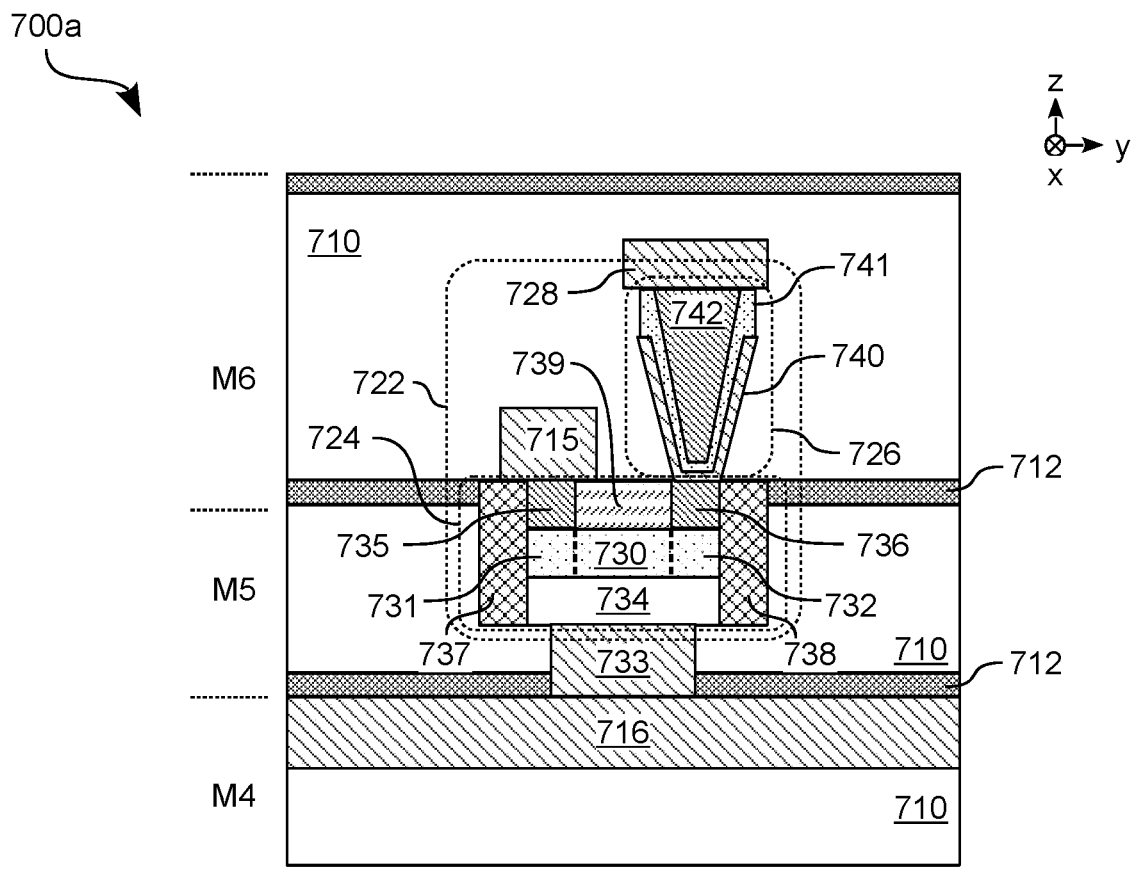

FIG. 7B schematically illustrates a diagram 700a of a memory cell 722 of array 720. As variously shown in FIGS. 7A, 7B, a thin film transistor TFT 724 of memory cell 722 comprises a source electrode 735 and a drain electrode 736 disposed each at a different respective end of a device body and formed in a back-end-of-line (BEOL) portion of structures on substrate 701, in accordance with some embodiments. In embodiments, the TFT 724 may be formed over one or more of the metal layers M1-M6 on substrate 701. For example, the TFT 724 may include a gate electrode 733 disposed above at least one of layers 710 over the substrate 701. A gate dielectric layer 734 may be above the gate electrode 733. The device body—comprised of a source area 731, a drain area 732, and a channel area 730 between the source area 731 and the drain area 732—may be above the gate electrode 733, and further above the gate dielectric layer 734. The device body may, for example, be of a rectangular shape separated from other devices by an isolation area 737 and an isolation area 738. The source electrode 735 may be above the source area 731 and, for example, aligned to an edge of the device body—e.g., where the drain electrode 736 is above the drain area 732 and, in some embodiments, aligned to an edge of the device body. A passivation layer 739 may be above the channel area 730 and between the source electrode 735 and the drain electrode 736. In addition, the isolation area 737 may be through the gate dielectric layer 734, next to the edge of the device body, and next to an edge of the source electrode 735. The isolation area 738 may extend through the gate dielectric layer 734, next to the edge of the device body, and next to an edge of the drain electrode 736.

Memory cell 722 further comprises a capacitor, such as the illustrative metal-insulator-metal (MIM) capacitor 726 shown). MIM capacitor 726 comprises a lower electrode 740 formed in a hole which extends at least in part through a dielectric layer 710 and/or a layer 712 over TFT 724, to an exposed portion of drain electrode 736. A dielectric layer 741 and an upper electrode 742 of MIM capacitor 726 are stacked and patterned on lower electrode 740.

Figure 7C:
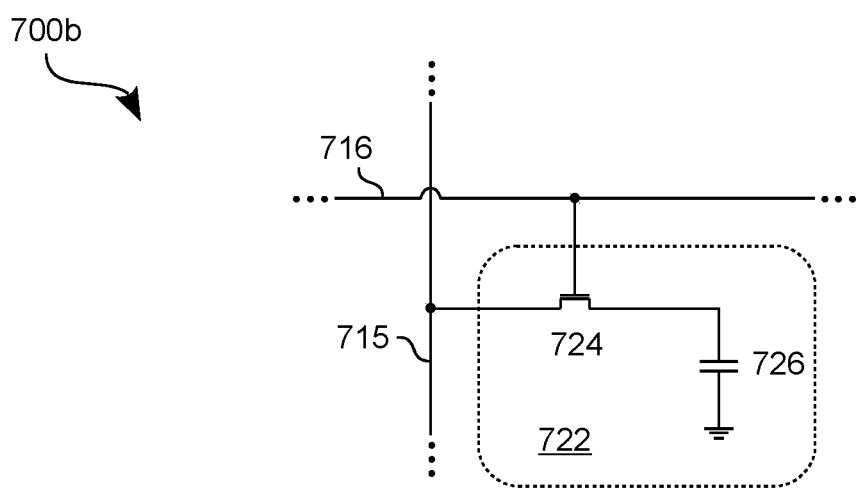
FIG. 7C is a circuit diagram illustrating structures of the integrated circuit chip shown in FIGS. 7A and 7B.

In such an embodiment, memory cell 722 may be coupled to a bit line 715 (e.g., one of interconnect structures 714) via source electrode 735. Memory cell 722 may be further coupled to word line 716 via gate electrode 733, and coupled to a ground electrode 728 via MIM capacitor 726. FIG. 7C illustrates a circuit diagram 700b which shows such coupling of memory cell 722 to bit line 715 and word line 716.

Manufacture of IC chip 700 may use some materials and processing which, for example, are adapted from conventional semiconductor fabrication techniques. In one example embodiment, semiconductor substrate 701 is a silicon substrate, a glass substrate, such as soda lime glass or borosilicate glass, a metal substrate, a plastic substrate, or other suitable substrate. Dielectric layers 710 may include one or more dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. Interconnect structures 714 may comprise any of a variety of conductors—e.g., including copper (Cu), gold (Au) and/or the like—which are used in conventional integrated circuit interconnects.

In some embodiments, gate electrode 733, source electrode 735, drain electrode 736, lower electrode 740 and/or upper electrode 742 comprise any of a variety of suitable conductors including, but not limited to, gold (Au), platinum (Pt), ruthenium (Ru), iridium (Ir), titanium (Ti), aluminum (Al), molybdenum (Mo), copper (Cu), tantalum (Ta), tungsten (W), nickel (Ni), chromium (Cr), hafnium (Hf), indium (In), or an alloy of Ti, Mo, Au, Pt, AlNi, Cu, Cr, TiAlN, HfAlN, or InAlO. For example, the gate electrode 733, the source electrode 735, or the drain electrode 736, may include tantalum nitride (TaN), titanium nitride (TiN), iridium-tantalum alloy (Ir—Ta), indium-tin oxide (ITO), the like, and/or a combination thereof.

The device body (comprising source area 731, drain area 732, and channel area 730) may comprise a material such as: indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, ShBN, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, or a group-VI transition metal dichalcogenide. The channel area 730 may have a thickness in a range of about 10 nm to about 100 nm, for example.

In various embodiments, the gate dielectric layer 734 and/or dielectric layer 741 include silicon and oxygen, silicon and nitrogen, yttrium and oxygen, silicon, oxygen, and nitrogen, aluminum and oxygen, hafnium and oxygen, tantalum and oxygen, or titanium and oxygen. For example, the gate dielectric layer 734 may include silicon oxide ($SiO_2$), silicon nitride (SiNx), yttrium oxide ($Y_2O_3$), silicon oxynitride (SiO,Ny), aluminum oxide ($AhO_3$), hafnium (IV) oxide ($HfO_2$), tantalum oxide ($Ta_2O_3O_5$), titanium dioxide ($TiO_2$), or other materials. Passivation layer 739 may include oxide or nitride of silicon (Si), germanium (Ge), aluminum (Al), gallium (Ga), zirconium (Zr), yttrium (Y), hafnium (Hf), vanadium (V), magnesium (Mg), calcium (Ca), barium (Ba), strontium (Sr), antimony (Sb), or tantalum (Ta).

Figure 8:
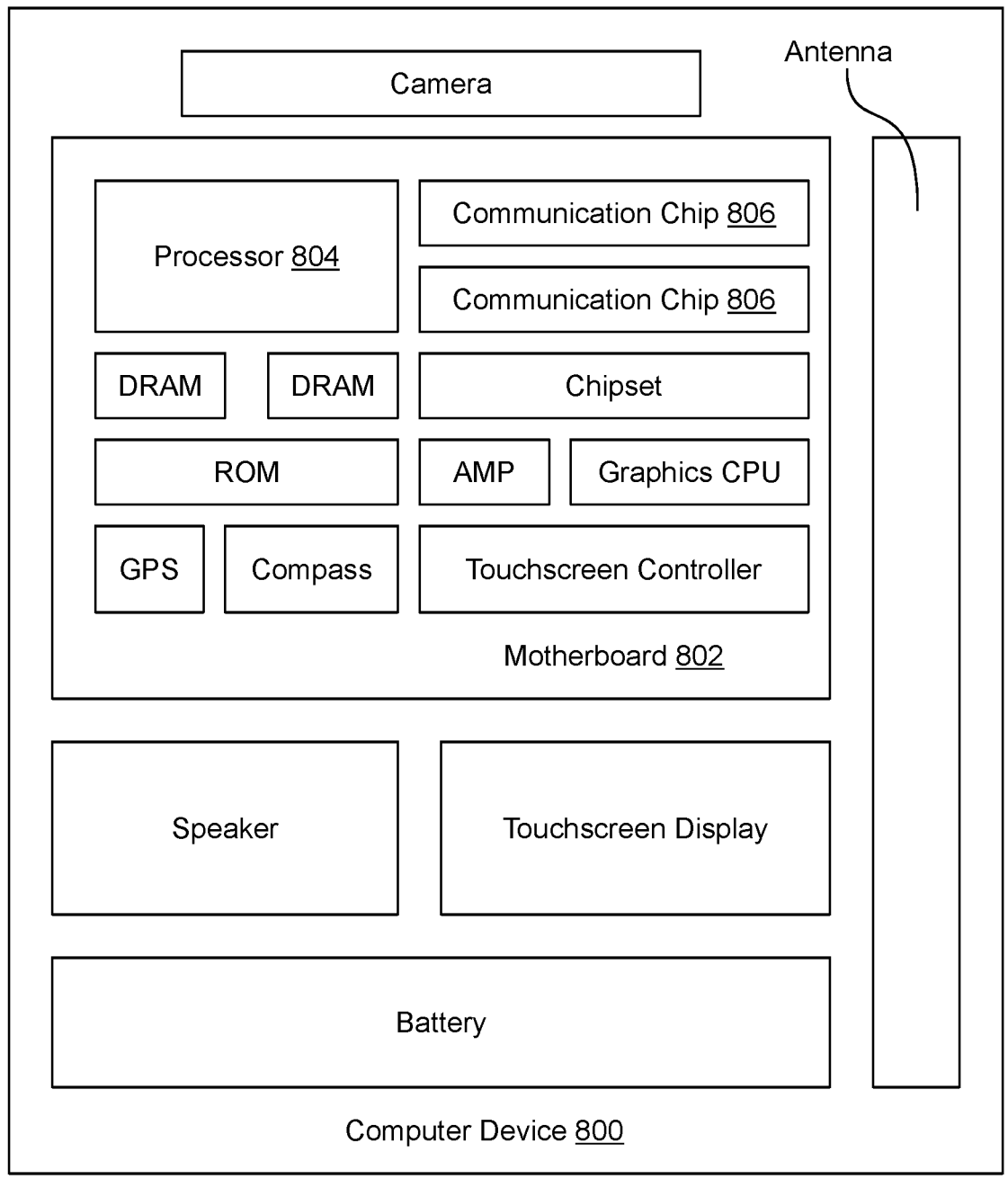
FIG. 8 is a functional block diagram illustrating a computing device in accordance with one embodiment.

FIG. 8 illustrates a computing device 800 in accordance with one embodiment. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. The term "processor" may refer to any device or portion of a device that processes electronic data from registers and/or memory to transform that electronic data into other electronic data that may be stored in registers and/or memory. The communication chip 806 also includes an integrated circuit die packaged within the communication chip 806.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 9:
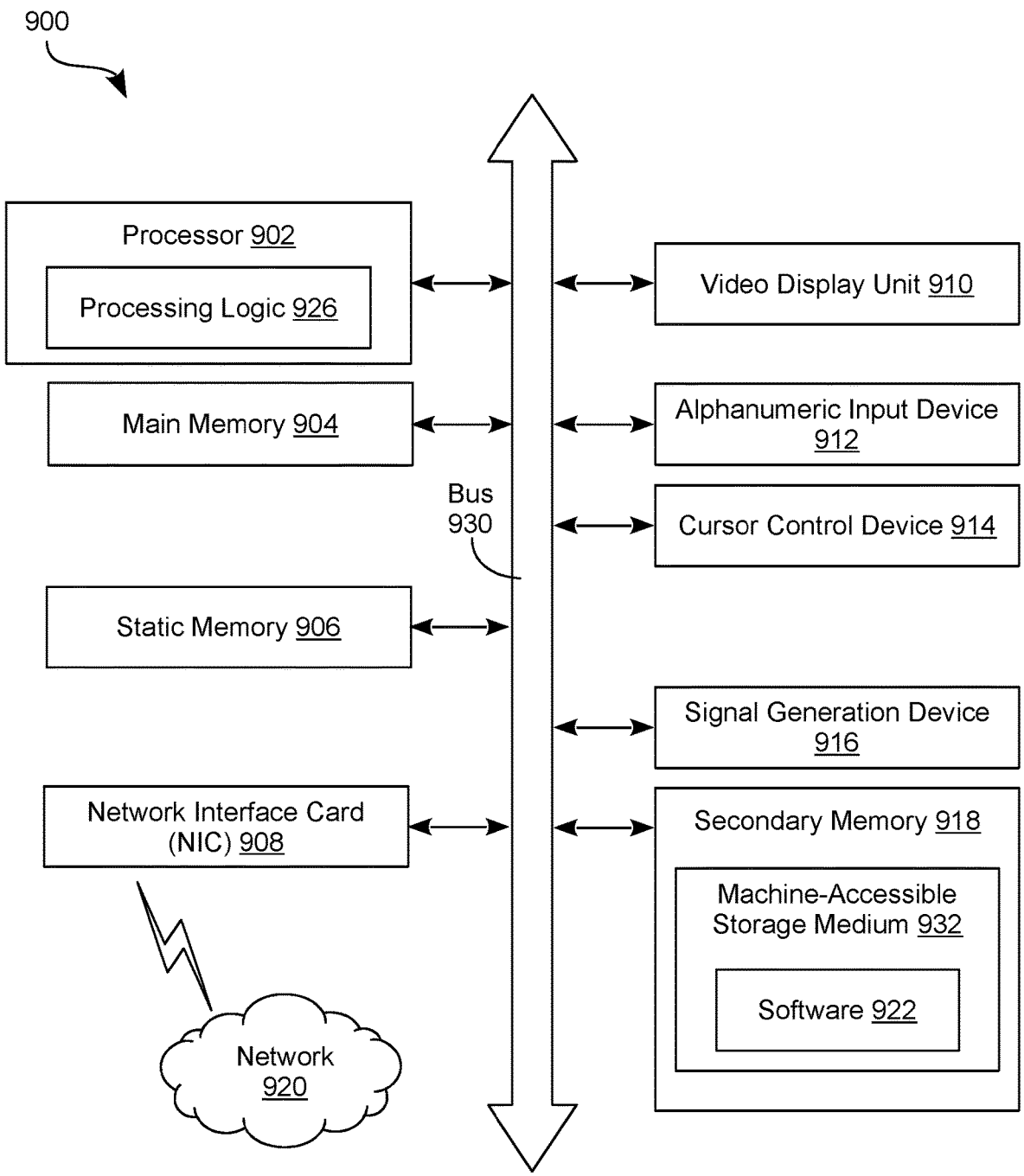
FIG. 9 is a functional block diagram illustrating an exemplary computer system, in accordance with one embodiment.

FIG. 9 illustrates a diagrammatic representation of a machine in the exemplary form of a computer system 900 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 900 includes a processor 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a secondary memory 918 (e.g., a data storage device), which communicate with each other via a bus 930.

Processor 902 represents one or more general-purpose processing devices such as a microprocessor, central processing unit, or the like. More particularly, the processor 902 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 902 may also be one or more special-purpose processing devices such as an application specific integrated circuit (ASIC), a field programmable gate array (FPGA), a digital signal processor (DSP), network processor, or the like. Processor 902 is configured to execute the processing logic 926 for performing the operations described herein.

The computer system 900 may further include a network interface device 908. The computer system 900 also may include a video display unit 910 (e.g., a liquid crystal display (LCD), a light emitting diode display (LED), or a cathode ray tube (CRT)), an alphanumeric input device 912 (e.g., a keyboard), a cursor control device 914 (e.g., a mouse), and a signal generation device 916 (e.g., a speaker).

The secondary memory 918 may include a machine-accessible storage medium (or more specifically a computer-readable storage medium) 932 on which is stored one or more sets of instructions (e.g., software 922) embodying any one or more of the methodologies or functions described herein. The software 922 may also reside, completely or at least partially, within the main memory 904 and/or within the processor 902 during execution thereof by the computer system 900, the main memory 904 and the processor 902 also constituting machine-readable storage media. The software 922 may further be transmitted or received over a network 920 via the network interface device 908.

While the machine-accessible storage medium 932 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Techniques and architectures for enabling an in-memory computation are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A memory device for performing a computation, the memory device comprising:
    first circuitry to couple the memory device to a memory controller and to receive first data from the memory controller;
    a first array of memory cells;
    a second array of memory cells;
    second circuitry coupled to operate the first array and the second array to:
        store the first data to the first array;
        communicate the first data from the first array to the second array;
        communicate from the second array a first signal which indicates a logic state based on a bit of the first data; and
        store a result of a data computation at the second array; and
    third circuitry coupled to receive the first signal and to perform the data computation based on the first signal.

2. The memory device of claim 1, wherein respective rows and columns of the first array and the second array each extend in parallel with a first plane, wherein the first array is offset from the second array in a direction orthogonal to the first plane.

3. The memory device of claim 2, wherein the second circuitry to operate the first array to store the first data to the first array comprises the second circuitry to decode an address of a memory location at the first array, wherein the second circuitry and the second array each extend in the first plane.

4. The memory device of claim 1, wherein a first integrated circuit die comprises the first array and the second array.

5. The memory device of claim 4, wherein the first array comprises embedded dynamic random access memory (eDRAM) cells, and wherein the second array comprises static random access memory (SRAM) cells.

6. The memory device of claim 1, wherein a die stack comprises:
    a first integrated circuit (IC) die comprising the first array;
    a second IC die comprising the second array; and
    through-silicon vias of the memory device, wherein the through-silicon vias are coupled between the first array and the second array via the second circuitry.

7. The memory device of claim 6, wherein the second IC die further comprises the first circuitry and the second circuitry.

8. The memory device of claim 1, wherein the second circuitry coupled to operate the first array and the second array to communicate the first data from the first array to the second array comprises the second circuitry to participate in an automatic performance of successive writes each to a different respective row of the second memory array, the successive writes according to a data transfer sequence which is predefined at the memory device.

9. The memory device of claim 1, further comprising:
    fourth circuitry to detect a condition comprising one of:

a completion of another data computation performed at the third circuitry;
a completion of a read from the second array;
a completion of a write to the first array; or
an expiration of a predefined time duration;
wherein the second circuitry to communicate the first data from the first array to the second array in response to the condition.

10. The memory device of claim 1, wherein the second circuitry comprises:
a first row decoder and a first column decoder to operate the first array; and
a second row decoder and a second column decoder to operate the second array.

11. The memory device of claim 1, wherein the first signal is based on an access of two stored data bits, wherein the logic state is an equivalent of an ANDing of the two stored data bits.

12. The memory device of claim 11, the second circuitry further to operate the second array to communicate, from the second array to the third circuitry, a second signal indicating another logic state based on the two stored data bits, wherein the third circuitry to perform the data computation further based on the second signal.

13. A method at a memory device for performing a computation, the method comprising:
receiving first data from a memory controller coupled to the memory device;
storing the first data to a first array of memory cells of the memory device;
after the storing, communicating the first data from the first array to a second array of memory cells of the memory device;
communicating, from the second array to first circuitry of the memory device, a first signal indicating a logic state based on a bit of the first data;
with the first circuitry, performing a data computation based on the first signal; and
storing a result of the data computation at the second array.

14. The method of claim 13, wherein respective rows and columns of the first array and the second array each extend in parallel with a first plane, wherein the first array is offset from the second array in a direction orthogonal to the first plane.

15. The method of claim 14, wherein the storing the first data to the first array comprises decoding an address of a memory location at the first array, the decoding with second circuitry, wherein the second array and the second circuitry each extend in the first plane.

16. The method of claim 13, wherein a first integrated circuit die comprises the first array and the second array.

17. The method of claim 16, wherein the storing the first data to the first array comprises decoding an address of a memory location at the first array, the decoding with second circuitry of the second IC die.

18. The method of claim 13, wherein communicating the first data from the first array to the second array comprises automatically performing successive writes each to a different respective row of the second memory array, the successive writes according to a data transfer sequence which is predefined at the memory device.

19. The method of claim 13, further comprising:
with second circuitry of the memory device, detecting a condition comprising one of:
a completion of another data computation performed at the third circuitry;
a completion of a read from the second array;
a completion of a write to the first array; or
an expiration of a predefined time duration;
wherein communicating the first data from the first array to the second array is in response to the condition.

20. A system for performing an in-memory computation, the system comprising:
a memory controller;
a memory device coupled to the memory controller, the memory device comprising:
first circuitry to receive first data from the memory controller;
a first array of memory cells;
a second array of memory cells;
second circuitry coupled to operate the first array and the second array to:
store the first data to the first array;
communicate the first data from the first array to the second array;
communicate from the second array a first signal which indicates a logic state based on a bit of the first data; and
store a result of a data computation at the second array; and
third circuitry coupled to receive the first signal and to perform the data computation based on the first signal; and
a display coupled to the memory device via the memory controller, the display device to generate a display based on the result of the data computation.

21. The system of claim 20, wherein respective rows and columns of the first array and the second array each extend in parallel with a first plane, wherein the first array is offset from the second array in a direction orthogonal to the first plane.

22. The system of claim 21, wherein the second circuitry to operate the first array to store the first data to the first array comprises the second circuitry to decode an address of a memory location at the first array, wherein the second circuitry and the second array each extend in the first plane.

23. The system of claim 20, wherein a first integrated circuit die comprises the first array and the second array.

24. The system of claim 20, wherein the second circuitry coupled to operate the first array and the second array to communicate the first data from the first array to the second array comprises the second circuitry to participate in an automatic performance of successive writes each to a different respective row of the second memory array, the successive writes according to a data transfer sequence which is predefined at the memory device.

* * * * *